(12) United States Patent
Dadvand (10) Patent No.: US 12,180,595 B2
(45) Date of Patent: Dec. 31, 2024

(54) CHEMICALLY ANCHORED MOLD COMPOUNDS IN SEMICONDUCTOR PACKAGES

(71) Applicant: TEXAS INSTRUMENTS INCORPORATED, Dallas, TX (US)

(72) Inventor: Nazila Dadvand, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 399 days.

(21) Appl. No.: 17/683,222

(22) Filed: Feb. 28, 2022

(65) Prior Publication Data
US 2023/0272536 A1     Aug. 31, 2023

(51) Int. Cl.
| | |
|---|---|
| *H01L 21/48* | (2006.01) |
| *C23C 22/40* | (2006.01) |
| *H01L 21/56* | (2006.01) |
| *H01L 23/31* | (2006.01) |
| *H01L 23/495* | (2006.01) |
| *H01L 23/00* | (2006.01) |

(52) U.S. Cl.
CPC .......... *C23C 22/40* (2013.01); *H01L 21/4835* (2013.01); *H01L 21/565* (2013.01); *H01L 23/3142* (2013.01); *H01L 23/49586* (2013.01); *H01L 24/32* (2013.01); *H01L 24/48* (2013.01); *H01L 2224/32245* (2013.01); *H01L 2224/48245* (2013.01)

(58) Field of Classification Search
CPC ....... H01L 21/48; H01L 21/56; H01L 21/565; H01L 21/4835; H01L 23/00; H01L 23/31; H01L 23/495; H01L 23/3142; H01L 23/3107; H01L 23/49586; H01L 24/27; H01L 24/32; H01L 24/48; H01L 2224/32245; H01L 2224/48245; C23C 22/40; C23C 22/52; C25D 3/58; C25D 5/34; C25D 7/12
USPC ......................................................... 438/123
See application file for complete search history.

(56) References Cited

U.S. PATENT DOCUMENTS

| | | | | |
|---|---|---|---|---|
| 2001/0034076 A1* | 10/2001 | Martin | ................... | B81B 3/0005 257/E21.261 |
| 2002/0127825 A1* | 9/2002 | Mui | ................... | H01L 24/03 257/E21.309 |
| 2003/0003320 A1* | 1/2003 | Matsuo | ................... | B32B 15/01 257/E21.175 |

* cited by examiner

*Primary Examiner* — Chuong A Luu
(74) *Attorney, Agent, or Firm* — Dawn Jos; Frank D. Cimino (57) ABSTRACT

In examples, a method of forming a semiconductor package comprises forming a conversion coating solution comprising a salt of a vanadate, a salt of a zirconate, or both with a complexing agent; cleaning a copper lead frame, wherein the cleaned copper lead frame comprises copper oxide on an outer surface thereof; immersing the cleaned copper lead frame in the conversion coating solution; rinsing the copper lead frame; and forming an assembly by coupling a semiconductor die to the copper lead frame, coupling the semiconductor die to a lead of the copper lead frame, applying a mold compound onto at least a portion of the outer surface of the copper lead frame, and curing the mold compound. An adhesion strength at an interface between the mold compound and the at least the portion of the outer surface of the copper lead frame is increased relative to a same assembly formed without immersing the copper lead frame in the conversion coating solution.

12 Claims, 7 Drawing Sheets

CHEMICALLY ANCHORED MOLD COMPOUNDS IN SEMICONDUCTOR PACKAGES

BACKGROUND

Semiconductor chips are often housed inside semiconductor packages that protect the chips from deleterious environmental influences, such as heat, moisture, and debris. A packaged chip communicates with electronic devices outside the package via conductive members, such as leads, that are exposed to surfaces of the package. Within the package, the chip may be electrically coupled to the conductive members using any suitable technique. One such technique is the flip-chip technique, in which the semiconductor chip (also called a "die") is flipped so the device side of the chip (in which circuitry is formed) is facing downward. The device side is coupled to the conductive members using, e.g., solder bumps. Another technique is the wire-bonding technique, in which the device side of the semiconductor chip is oriented upward and is coupled to the conductive members using bond wires.

SUMMARY

In examples, a method of forming a semiconductor package comprises forming a conversion coating solution comprising a salt of a vanadate, a salt of a zirconate, or both with a complexing agent; cleaning a copper lead frame, wherein the cleaned copper lead frame comprises copper oxide on an outer surface thereof; immersing the cleaned copper lead frame in the conversion coating solution; rinsing the copper lead frame; and forming an assembly by coupling a semiconductor die to the copper lead frame, coupling the semiconductor die to a lead of the copper lead frame, applying a mold compound onto at least a portion of the outer surface of the copper lead frame, and curing the mold compound. An adhesion strength at an interface between the mold compound and the at least the portion of the outer surface of the copper lead frame is increased relative to a same assembly formed without immersing the copper lead frame in the conversion coating solution.

In examples, a semiconductor package comprises a die pad and a lead chemically bonded to a mold compound via a conversion coating of the die pad and the lead with zirconate, vanadate, or a combination thereof, or a co-deposited layer of copper and tungsten on the die pad and the lead.

DETAILED DESCRIPTION

In a semiconductor package, a semiconductor die is generally coupled to a die pad (e.g., using a die attach material), and the die is coupled to conductive members (e.g., leads) using bond wires, conductive bumps, etc. The die pad and the conductive members are obtained from a lead frame and are generally composed of copper. During package manufacture, a mold compound is applied to cover the die, the die pad, the conductive members, the bond wires or conductive bumps, and any other components that are included in the package. Thus, the mold compound abuts the die pad and the conductive members. The adhesion strength between the mold compound and the die pad and between the mold compound and the conductive members depends on the roughness of the die pad/conductive members, mechanical anchoring, etc. These techniques often result in delamination between the mold compound and the die pad and between the mold compound and the conductive members. Delamination can result in the diminished structural and/or functional integrity of the package.

This disclosure describes various examples of techniques for chemically anchoring a mold compound to a lead frame that is subsequently used to produce the die pad and the conductive members of a package. In one example, a lead frame is dipped in a conversion coating solution. The conversion coating solution may be formed, for example, by mixing a salt of a zirconate with a complexing agent, a salt of a vanadate with a complexing agent, or a combination thereof. When the lead frame is dipped in the conversion coating solution, the zirconate, vanadate, or combination thereof in the conversion coating solution forms chemical bonds with the copper in a copper oxide layer on a surface of the lead frame. The resulting layer may be referred to herein as a conversion coating layer, and a surface of the conversion coating layer includes free hydroxyl groups that bond with functional groups (e.g., hydroxides) in a mold compound when the mold compound is applied to the conversion coating layer and cured. In this way, the free hydroxyl groups in the conversion coating layer are incorporated into a skeleton (a backbone) of the mold compound upon curing. Stated another way, the mold compound is chemisorbed on the conversion coating layer of the lead frame. Consequently, the mold compound is chemically anchored to the lead frame (e.g., the die pad and the conductive members).

In other examples, a layer of copper tungsten is electroplated onto the copper oxide surface of the die pad and the conductive members. The copper tungsten is acidic and dissolves the copper oxide. The copper tungsten layer adheres strongly to the lead frame because both the copper tungsten layer and the lead frame are metallic. The copper tungsten layer includes hydroxylated hydroxide groups that chemically bond with hydroxide groups in the mold compound upon curing. In this way, the mold compound is chemically anchored to the lead frame (e.g., the die pad and the conductive members).

Figure 7:
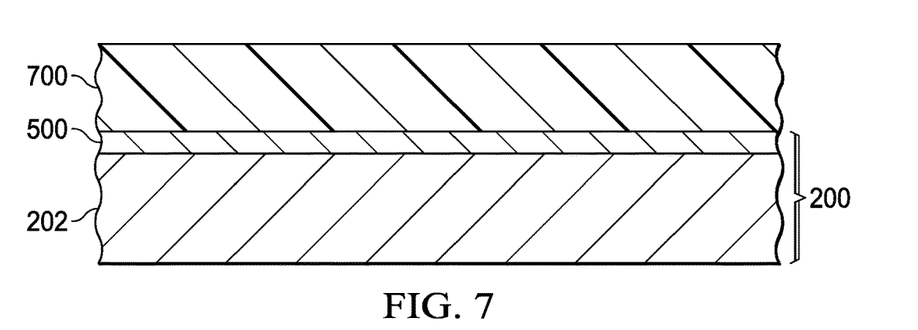
FIG. 7 is a cross-sectional view of a copper lead frame having a conversion coating layer and a mold compound abutting and chemically bonded to the conversion coating layer, in accordance with various examples.
Figure 8:
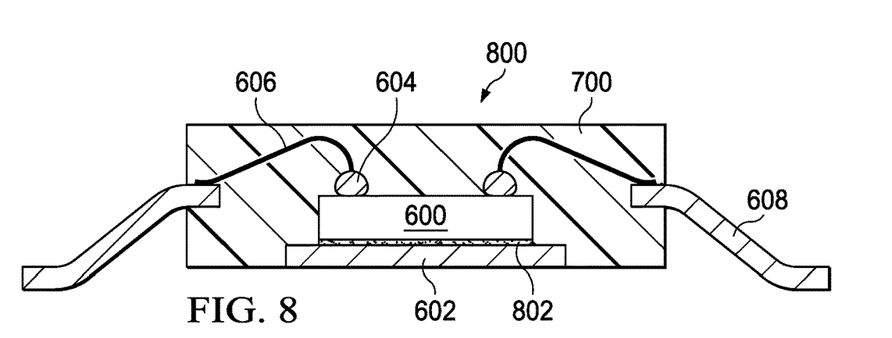
FIG. 8 is a cross-sectional view of a semiconductor package having a mold compound that is chemically anchored to a die pad and conductive terminals, in accordance with various examples.
Figure 9:
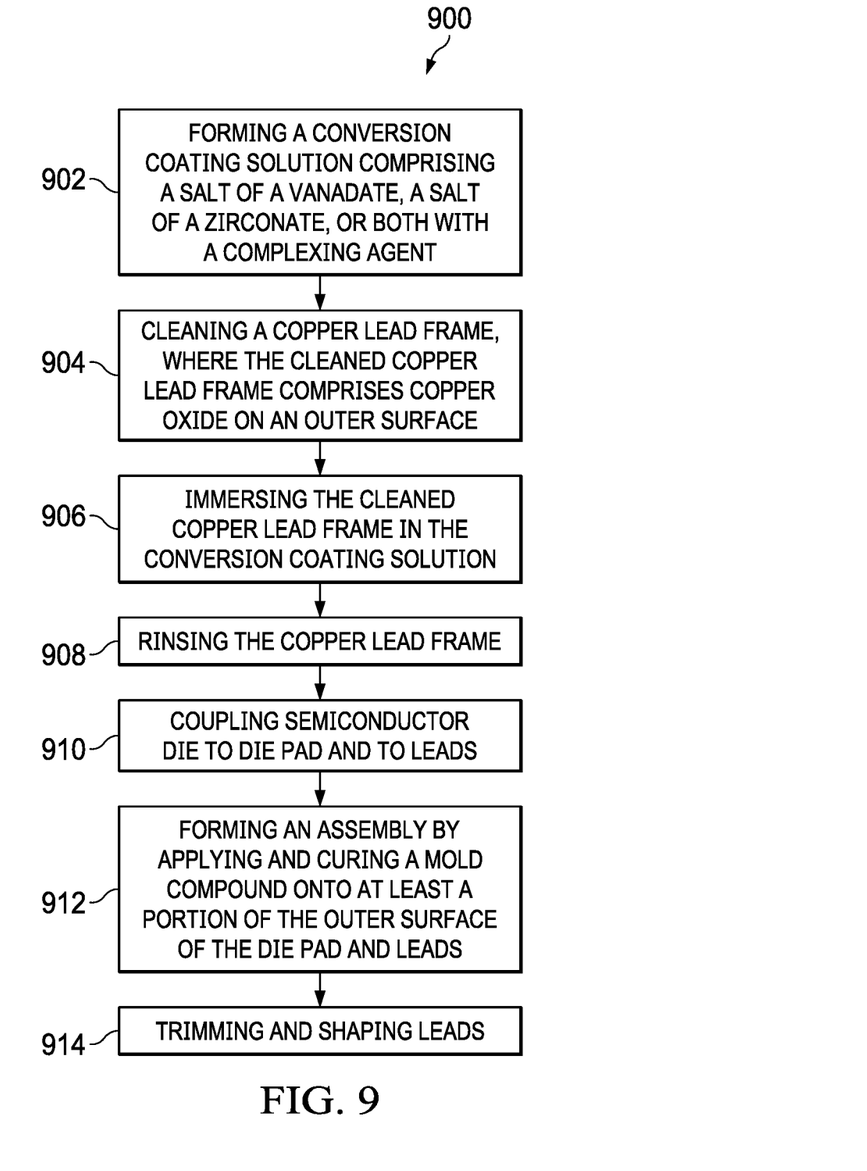
FIG. 9 is a flow diagram of a method for manufacturing a semiconductor package having a mold compound that is chemically anchored to a die pad and conductive terminals, in accordance with various examples.

FIGS. 1-8 form a process flow for manufacturing a semiconductor package having a mold compound that is chemically anchored to a die pad and conductive terminals, in accordance with various examples. FIG. 9 is a flow diagram of a method 900 for manufacturing a semiconductor package having a mold compound that is chemically anchored to a die pad and conductive terminals, in accordance with various examples. Accordingly, FIGS. 1-8 and 9 are described in parallel.

Figure 1:
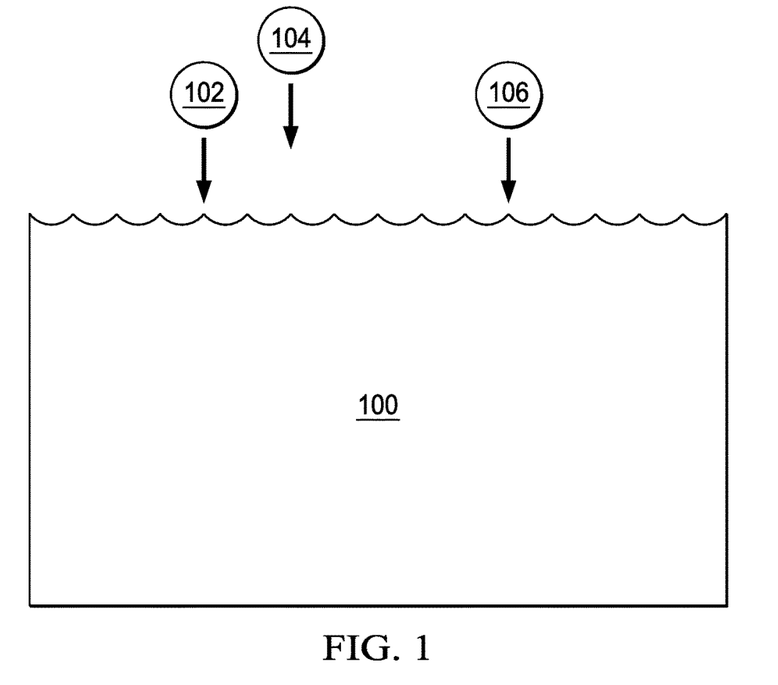
FIG. 1 is a schematic diagram depicting the mixing of a salt of a zirconate, a salt of a vanadate, or a combination thereof with one or more complexing agents to produce a conversion coating solution, in accordance with various examples.

The method 900 begins with forming a conversion coating solution comprising a salt of a vanadate, a salt of a zirconate, or both with a complexing agent (902). FIG. 1 is a schematic diagram depicting the mixing of a salt of a zirconate, a salt of a vanadate, or a combination thereof with one or more complexing agents to produce a conversion coating solution, in accordance with various examples. More specifically, a conversion coating solution 100 is formed by mixing a salt of a zirconate 102 and one or more complexing agents 104, a salt of a vanadate 106 and one or more complexing agents 104, or a salt of a zirconate 102 and a salt of a vanadate 106 and one or more complexing agents 104. In examples, the salt of the zirconate 102 is zirconium oxynitrate. In examples, the salt of the vanadate 106 is vanadium oxynitrate. Other salts are contemplated. In examples, the one or more complexing agents 104 includes ethylene diamine. In examples, the one or more complexing agents 104 includes ethylenediaminetetraacetic acid. Other complexing agents are contemplated. In examples, the conversion coating solution 100 is an acid having a pH ranging from 1 to 4, with a pH above this range being disadvantageous because the solution can be difficult or dangerous to handle, and with a pH below this range being disadvantageous because of the resulting precipitative effects. In various examples, the relative concentrations of salts in the conversion coating solution 100 is 0% salt of zirconate and 100% salt of vanadate; 25% salt of zirconate and 75% salt of vanadate; 50% salt of zirconate and 50% salt of vanadate; 75% salt of zirconate and 25% salt of vanadate; and 100% salt of zirconate and 0% salt of vanadate. In examples, the conversion coating solution 100 is an acid having a pH ranging from 1 to 4.

Figure 2:
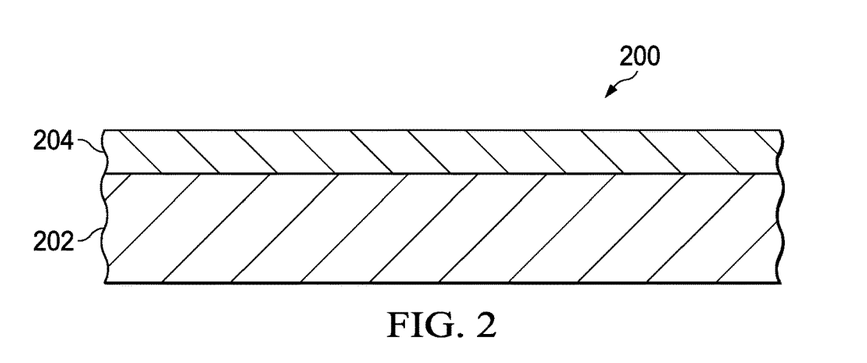
FIG. 2 is a cross-sectional view of a non-roughened copper lead frame having a copper oxide layer, in accordance with various examples.
Figure 3:
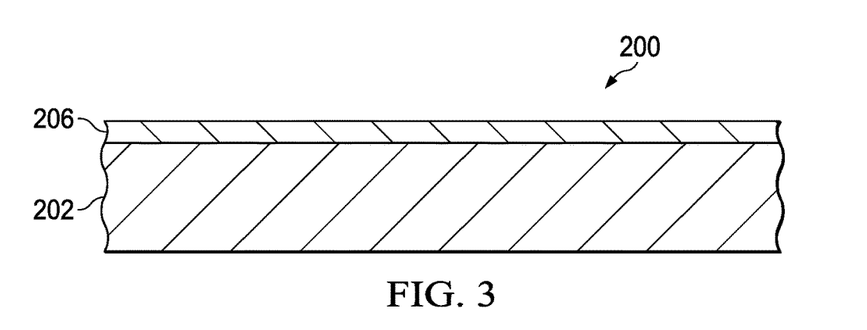
FIG. 3 is a cross-sectional view of a non-roughened copper lead frame having a thinned copper oxide layer, in accordance with various examples.

The method 900 includes cleaning a copper lead frame, where the cleaned copper lead frame includes copper oxide on an outer surface (904). FIG. 2 is a cross-sectional view of a non-roughened copper lead frame 200, in accordance with various examples. A non-roughened copper lead frame is one that has not been subjected to a specific roughening process. The lead frame 200 includes a pure copper layer 202 (e.g., at least 100% copper, at least 99% copper, at least 98% copper, at least 95% copper) and a thin copper oxide layer 204 abutting the pure copper layer 202. FIG. 3 is a cross-sectional view of the lead frame 200 having a thinned copper oxide layer 206, in accordance with various examples. The copper oxide layer 206 may be thinned by the cleaning process of step 904, for example, a deoxidation process. The cleaning (deoxidation) process is performed using 10% sulfuric acid, and it is carried out by immersion for no more than 30 seconds at room temperature. A longer immersion than this range may be deleterious because it dissolves too much or all of the copper oxide layer 204.

Figure 4:
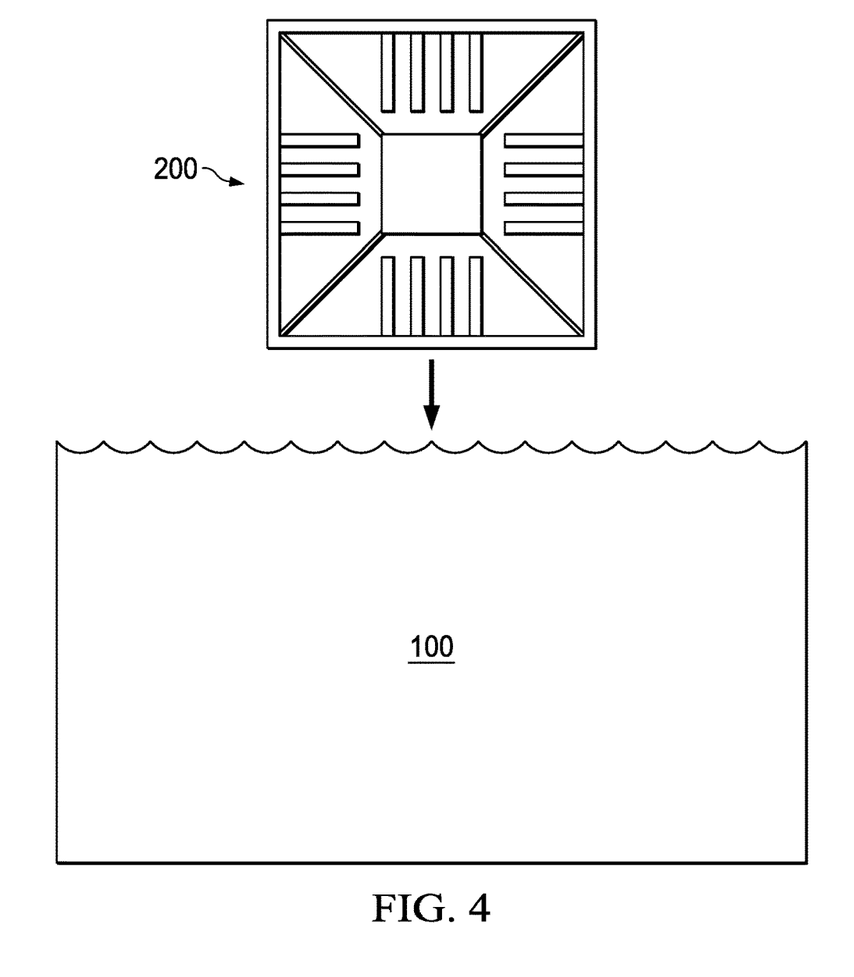
FIG. 4 is a schematic diagram depicting the dipping of a copper lead frame in a conversion coating solution, in accordance with various examples.
Figure 5:
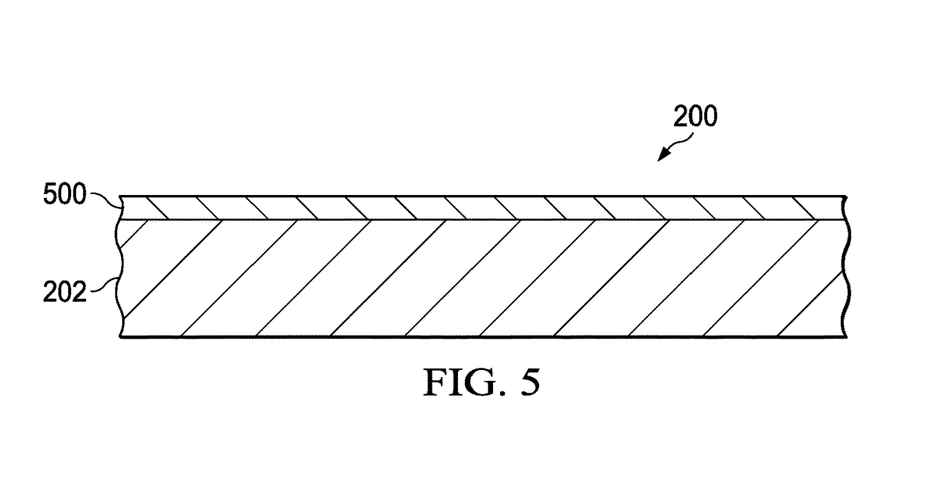
FIG. 5 is a cross-sectional view of a copper lead frame having a conversion coating layer, in accordance with various examples.

The method 900 includes immersing the cleaned copper lead frame in the conversion coating solution (906). FIG. 4 is a schematic diagram depicting the immersion of a lead frame 200 in the conversion coating solution 100, in accordance with various examples. FIG. 5 is a cross-sectional view of the lead frame 200 having a conversion coating layer 500 (e.g., comprising vanadate of copper, zirconate of copper, or both) abutting the pure copper layer 202, in accordance with various examples. Immersing the cleaned copper lead frame 200 in the conversion coating solution 100 results in a condensation reaction between the zirconate, the vanadate, or both with the copper oxide. The lead frame 200 as depicted in FIG. 4 depicts only one lead frame as opposed to a lead frame strip, but the techniques described herein may be extended to any number of lead frames in a lead frame strip. The complexing agents 104 make the zirconate and vanadate salts more reactive with the copper oxide layer on the surface of the lead frame 200 by inducing a positive charge on zirconium or vanadium atoms in the zirconate or vanadate salts, respectively. The complexing agents 104 may also stabilize such a positive charge to facilitate reaction with copper oxide. The zirconate or vanadate chemically bonds to copper atoms via the oxygen atoms in the copper oxide layer of the lead frame 200. In the case where both zirconate and vanadate are included in the conversion coating solution 100, the zirconate and vanadate compete for copper atoms in the copper oxide layer, with the relative concentrations of zirconate and vanadate affecting such competition and the relative energy requirements of each for bond formation affecting such competition. For example, if the zirconate has a higher concentration and lower energy requirements for bond formation, the zirconate may out-compete the vanadate for copper atoms in the copper oxide layer. By establishing such bonds, the conversion coating layer 500 is formed, abutting the pure copper layer 202.

The immersion of the lead frame 200 in the conversion coating solution 100 may be performed for less than or equal to 5 minutes, 4 minutes, 3 minutes, 2 minutes, or 1 minute. The immersion is effected at a temperature less than or equal to 40 degrees Celsius, 35 degrees Celsius, 30 degrees Celsius, 25 degrees Celsius, or 20 degrees Celsius. In examples, the immersion is effected at a temperature that is within 10-15 degrees Celsius of room temperature. In examples, the immersion is performed for 2 minutes at 30 degrees Celsius. The application of heat facilitates formation of the chemical bonds described above between the zirconate, vanadate, and copper oxide layer. The copper lead frame may then be rinsed (908), for example, with deionized water.

Figure 6:
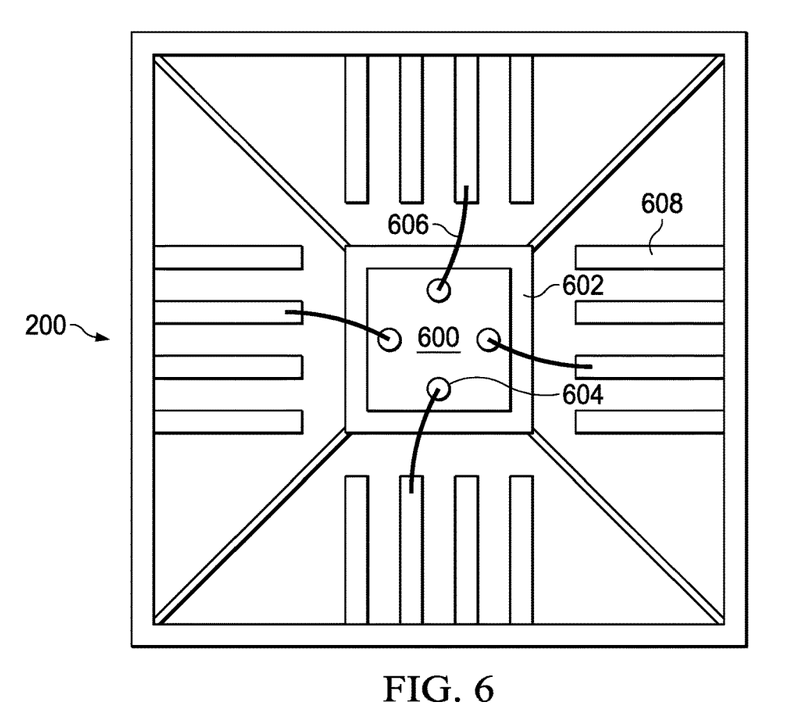
FIG. 6 is a top-down view of a copper lead frame having a conversion coating layer and a semiconductor die coupled thereto, in accordance with various examples.

The method 900 comprises coupling a semiconductor die to a die pad and leads of the lead frame (910). FIG. 6 is a top-down view of the copper lead frame 200 having a conversion coating layer and a semiconductor die coupled thereto, in accordance with various examples. More specifically, the lead frame 200 is coated with the conversion coating layer (e.g., on all surfaces of the lead frame 200, or on a subset of surfaces of the lead frame 200). A semiconductor die 600 is coupled to a die pad 602. Wirebond bumps 604 are formed on the semiconductor die 600 (e.g., on bond pads on a device side of the semiconductor die 600), and bond wires 606 are coupled to the wirebond bumps 604 and to leads 608.

The method 900 includes forming an assembly by applying and curing a mold compound onto at least a portion of the outer surface of the die pad and leads (912). FIG. 7 is a cross-sectional view of the lead frame 200 having the pure copper layer 202, the conversion coating layer 500, and a mold compound 700 (e.g., an epoxy) abutting and chemically bonded to the conversion coating layer, in accordance with various examples. The mold compound 700 may be injected into a mold chase in which the lead frame 200 is positioned, for example. When applied to the lead frame 200, and more specifically to the conversion coating layer 500, and then cured, functional groups (e.g., hydroxides) in the mold compound 700 chemically react with free hydroxyl (—OH) groups on the surface of the conversion coating layer 500. These free hydroxyl groups are produced when the copper oxide layer of the lead frame bonds to the conversion coating solution as described above. Stated another way, upon application and subsequent curing of the mold compound 700, the free hydroxyl groups on the surface of the conversion coating layer 500 bond to the backbone or skeleton of the mold compound 700. In this way, the mold compound 700 may be said to be chemically anchored to the conversion coating layer 500, to the pure copper layer 202, or more generally to the lead frame 200.

The method 900 includes trimming and shaping the leads (e.g., to form a gullwing shape) (914). FIG. 8 is a cross-sectional view of a semiconductor package 800 having the mold compound 700 that is chemically anchored to the die pad 602 and conductive terminals 608 (e.g., leads), in accordance with various examples. The semiconductor die 600 is coupled to the die pad 602 by a die attach layer 802. The conversion coating layer 500 is present on some or all of the die pad 602 and/or the conductive terminals 608. The mold compound 700 is chemically anchored as described above. Although FIG. 8 shows a gullwing-style package (e.g., a dual-inline package (DIP)), the chemical anchoring techniques described herein may be extended to any and all types of semiconductor packages in which a mold compound abuts a copper layer and delamination is undesirable.

Figure 13:
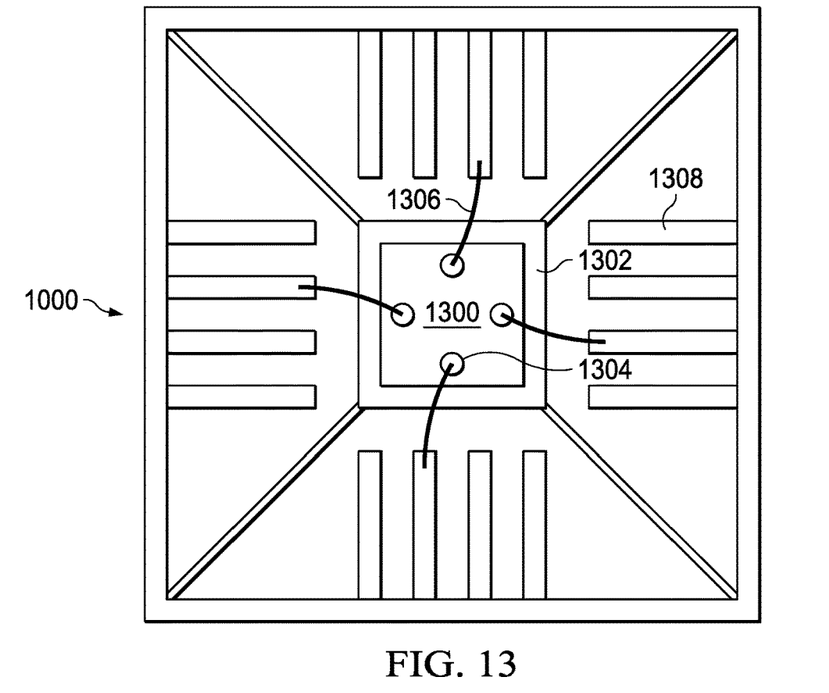
FIG. 13 is a top-down view of a copper lead frame having a copper tungsten electroplated layer and a semiconductor die coupled thereto, in accordance with various examples.
Figure 14A:
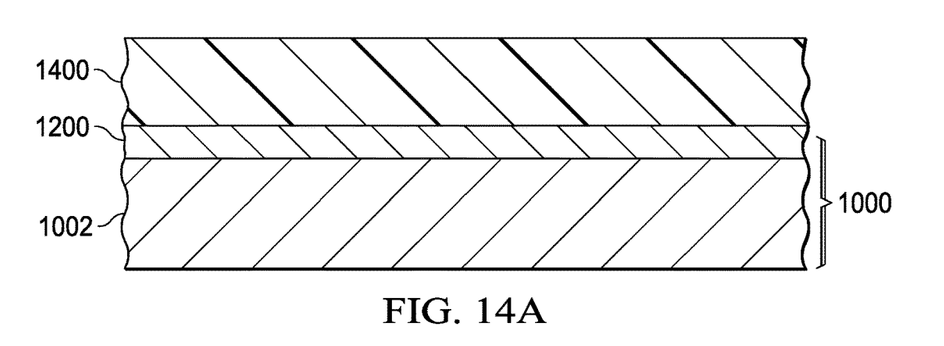
FIG. 14A is a cross-sectional view of a copper lead frame having a copper tungsten electroplated layer coupled thereto and a mold compound chemically anchored to the copper tungsten electroplated layer, in accordance with various examples.
Figure 14B:
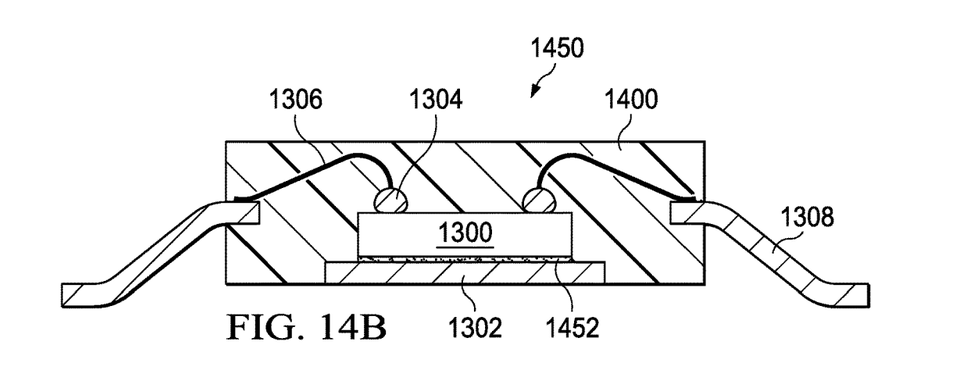
FIG. 14B is a cross-sectional view of a semiconductor package having a mold compound that is chemically anchored to a die pad and conductive terminals, in accordance with various examples.
Figure 15:
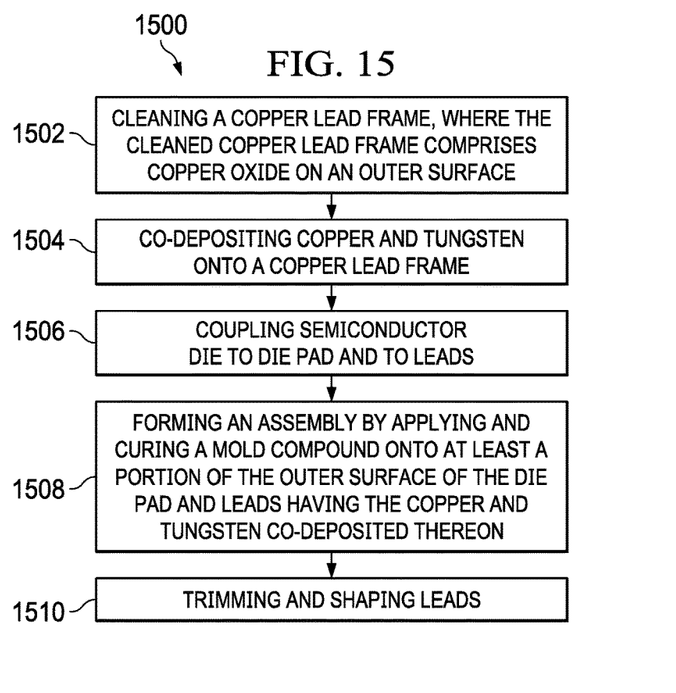
FIG. 15 is a flow diagram of a method for manufacturing a semiconductor package having a mold compound that is chemically anchored to a die pad and conductive terminals, in accordance with various examples.

FIGS. 10-14B form a process flow for manufacturing a semiconductor package having a mold compound that is chemically anchored to a die pad and conductive terminals, in accordance with various examples. FIG. 15 is a flow diagram of a method 1500 for manufacturing a semiconductor package having a mold compound that is chemically anchored to a die pad and conductive terminals, in accordance with various examples. Accordingly, FIGS. 10-14B and 15 are now described in parallel.

Figure 10:
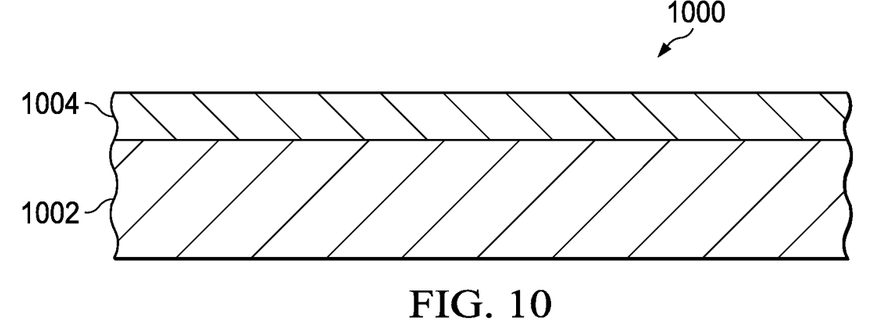
FIG. 10 is a cross-sectional view of a non-roughened copper lead frame having a copper oxide layer, in accordance with various examples.
Figure 11:
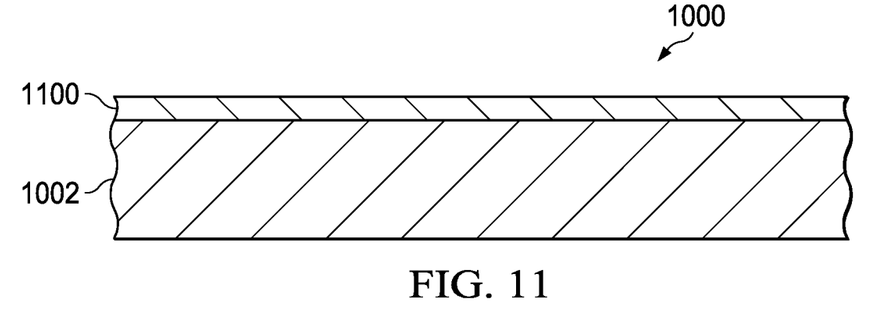
FIG. 11 is a cross-sectional view of a non-roughened copper lead frame having a thinned copper oxide layer, in accordance with various examples.

The method 1500 includes cleaning a copper lead frame, where the cleaned copper lead frame includes copper oxide on an outer surface (1502). FIG. 10 is a cross-sectional view of a non-roughened copper lead frame 1000 having a copper oxide layer, in accordance with various examples. More specifically, the lead frame 1000 includes a pure copper layer 1002 and a copper oxide layer 1004 abutting the pure copper layer 1002. FIG. 11 is a cross-sectional view of a non-roughened copper lead frame 1000 having the pure copper layer 1002 and a thinned copper oxide layer 1100 abutting the pure copper layer 1002, in accordance with various examples.

Figure 12:
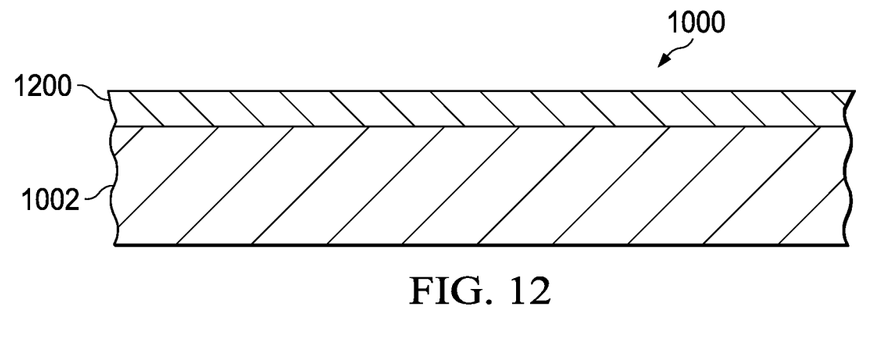
FIG. 12 is a cross-sectional view of a copper lead frame having a copper tungsten layer electroplated on the copper lead frame, in accordance with various examples.

The method 1500 includes co-depositing copper and tungsten onto the copper lead frame (1504). FIG. 12 is a cross-sectional view of the copper lead frame 1000 having a copper tungsten (CuW) alloy layer 1200 being electroplated on the copper lead frame 1000, in accordance with various examples. The copper tungsten layer 1200 is acidic and has a pH in the range of 1 to 4. In examples, the copper tungsten layer 1200 has a pH of 3. The acidic pH of the copper tungsten layer 1200 dissolves the copper oxide layer 1100 (FIG. 11) upon electroplating. The copper tungsten layer 1200 strongly adheres to the pure copper layer 1002 because the two layers are metallic.

The method 1500 includes coupling a semiconductor die to a die pad and leads (1506). FIG. 13 is a top-down view of a copper lead frame 1000 having a copper tungsten electroplated layer and a semiconductor die coupled thereto, in accordance with various examples. More specifically, the copper lead frame 1000 includes a semiconductor die 1300 coupled to a die pad 1302. Wirebond balls 1304 are coupled to a device side (e.g., bond pads on a device side) of the semiconductor die 1300. Bond wires 1306 are coupled to the wirebond balls 1304 and leads 1308.

The method 1500 includes forming an assembly by applying and curing a mold compound onto at least a portion of the outer surface of the die pad and leads having the copper tungsten co-deposited thereon (1508). FIG. 14A is a cross-sectional view of a copper lead frame having a copper tungsten electroplated layer coupled thereto and a mold compound chemically anchored to the copper tungsten electroplated layer, in accordance with various examples. Specifically, the copper lead frame 1000 includes the pure copper layer 1002 and the electroplated copper tungsten layer 1200 abutting and coupled to the copper lead frame 1000. During the mold compound injection process, the copper tungsten layer 1200 is exposed to water vapor in the ambient air, which becomes hydroxylated and forms hydroxide groups in the copper tungsten layer 1200. In examples, a hydroxylated form of tungstate is formed in the copper tungsten layer 1200. When the mold compound 1400 is applied to the copper tungsten layer 1200 and cured, hydroxide groups in the mold compound 1400 chemically bond to hydroxide groups in the copper tungsten layer 1200.

The method 1500 includes trimming and shaping leads (e.g., into a gullwing shape) (1510). FIG. 14B is a cross-sectional view of a semiconductor package 1450 having the mold compound 1400 that is chemically anchored to the die pad 1302 and conductive terminals 1308 (e.g., leads), in accordance with various examples. The semiconductor die 1300 is coupled to the die pad 1302 by a die attach layer 1452. The copper tungsten layer 1200 is present on some or all of the die pad 1302 and/or the conductive terminals 1308. The mold compound 1400 is chemically anchored as described above. Although FIG. 14B shows a gullwing-style package (e.g., a dual-inline package (DIP)), the chemical anchoring techniques described herein may be extended to any and all types of semiconductor packages in which a mold compound abuts a copper layer and delamination is undesirable.

Figure 16:
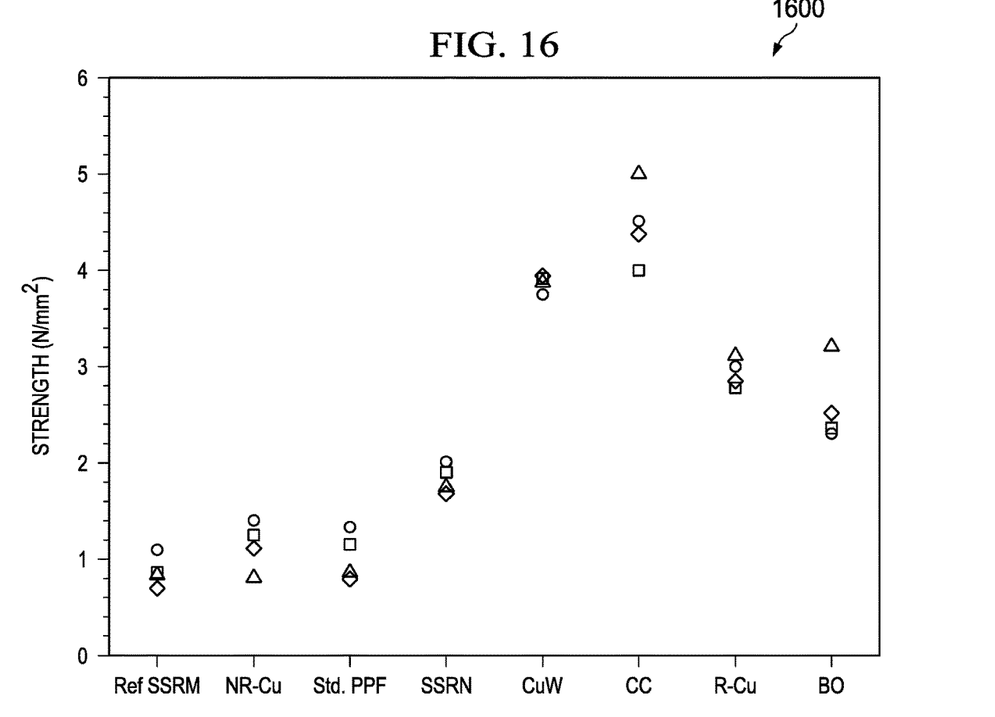
FIG. 16 is a graph depicting the superior adhesion strength of the chemical anchoring techniques described herein relative to other approaches, in accordance with various examples.

FIG. 16 is a graph 1600 of test data depicting the superior adhesion strength of the chemical anchoring techniques described herein relative to other approaches, in accordance with various examples. The y-axis indicates adhesion strength in Newtons per mm$^2$ (N/mm$^2$). A reference Shinko single side rough nickel technique (Ref SSRN) for increasing adhesion strength between a mold compound of a package and other components in the package produces an average measured adhesion strength of approximately 1 N/mm$^2$. A non-roughened copper lead frame (NR-Cu) produces an average measured adhesion strength of approximately 1.2 N/mm$^2$. A smooth pre-plated leadframe (PPF) finish produces an average measured adhesion strength of approximately 1.2 N/mm$^2$. Another SSRN technique produces an average measured adhesion strength of approximately 1.9 N/mm$^2$. A roughening on bare copper technique produces an average measured adhesion strength of approximately 3 N/mm$^2$. A brown oxide produces an average measured adhesion strength of approximately 2.6 N/mm$^2$. The chemically anchoring techniques described herein, however, consistently produce superior adhesion strength, with the conversion coating technique producing an average adhesion strength of approximately 4.5 N/mm2, and with the electroplating technique producing an average adhesion strength of approximately 3.9 N/mm$^2$.

Unless otherwise stated, "about," "approximately," or "substantially" preceding a value means +/−10 percent of the stated value. Modifications are possible in the described examples, and other examples are possible within the scope of the claims.

What is claimed is:

1. A method of forming a semiconductor package, comprising:
   forming a conversion coating solution comprising a salt of a vanadate, a salt of a zirconate, or both with a complexing agent;
   cleaning a copper lead frame, wherein the cleaned copper lead frame comprises copper oxide on an outer surface thereof;
   immersing the cleaned copper lead frame in the conversion coating solution;
   rinsing the copper lead frame; and
   forming an assembly by:
      coupling a semiconductor die to the copper lead frame;
      coupling the semiconductor die to a lead of the copper lead frame;
      applying a mold compound onto at least a portion of the outer surface of the copper lead frame; and
      curing the mold compound,
   wherein an adhesion strength at an interface between the mold compound and the at least the portion of the outer surface of the copper lead frame is increased relative to a same assembly formed without immersing the copper lead frame in the conversion coating solution.

2. The method of claim 1, wherein the complexing agent comprises ethylenediaminetetraacetic acid (EDTA), ethylene diamine, or a combination thereof.

3. The method of claim 1, wherein the conversion coating solution further comprises an acid.

4. The method of claim 1, wherein immersing comprises immersing the copper lead frame in the conversion coating solution comprises immersing for less than or equal to about 5, 4, 3, 2, or 1 minute.

5. The method of claim 1, wherein the immersing is effected at an immersion temperature of less than or equal to about 35, 30, or 25° C.

6. The method of claim 1, wherein the immersing of the cleaned copper lead frame in the conversion coating solution provides a conversion coated copper lead frame comprising free hydroxyl groups on the outer surface.

7. The method of claim 6, wherein the mold compound is chemisorbed on the conversion coated copper lead frame.

8. The method of claim 6, wherein the conversion coated copper lead frame comprises zirconate of copper, vanadate of copper, or both on the outer surface.

9. The method of claim 6, wherein at least a portion of the free hydroxyl groups are incorporated into a backbone of the mold compound during the curing.

10. The method of claim 6, wherein the mold compound comprises an epoxy and comprises free hydroxyl groups.

11. The method of claim 1, wherein rinsing comprises rinsing with deionized water.

12. The method of claim 1, wherein the immersing the cleaned copper lead frame in the conversion coating solution results in a condensation reaction between the zirconate, the vanadate, or both with the copper oxide.

* * * * *